(12) United States Patent
Lin

(10) Patent No.: US 11,147,176 B1
(45) Date of Patent: Oct. 12, 2021

(54) PROTECTIVE COVER ASSEMBLY AND PROTECTED ELECTRONIC DEVICE

(71) Applicant: Meiling Hung, Hsinchu (TW)

(72) Inventor: Anny Lin, Hsinchu (TW)

(73) Assignee: Meiling Hung, Hsinchu (TW)

( * ) Notice: Subject to any disclaimer, the term of this patent is extended or adjusted under 35 U.S.C. 154(b) by 0 days.

(21) Appl. No.: 17/014,528

(22) Filed: Sep. 8, 2020

(51) Int. Cl.
| | |
|---|---|
| *H05K 5/06* | (2006.01) |
| *C09J 7/25* | (2018.01) |
| *C09J 7/40* | (2018.01) |
| *C09J 7/22* | (2018.01) |
| *C09J 7/20* | (2018.01) |
| *G07G 1/00* | (2006.01) |
| *C09J 7/38* | (2018.01) |
| *B29C 71/00* | (2006.01) |
| *H05K 5/00* | (2006.01) |

(Continued)

(52) U.S. Cl.
CPC ......... *H05K 5/069* (2013.01); *B29C 71/0009* (2013.01); *C09J 7/25* (2018.01); *C09J 7/38* (2018.01); *C09J 7/405* (2018.01); *G07G 1/0018* (2013.01); *H05K 5/0017* (2013.01); *H05K 5/0095* (2013.01); *B29C 2071/0045* (2013.01); *B29K 2083/00* (2013.01); *B29L 2031/3481* (2013.01); *B29L 2031/466* (2013.01); *C09J 7/20* (2018.01); *C09J 7/22* (2018.01); *C09J 7/40* (2018.01); *C09J 2203/326* (2013.01); *C09J 2301/124* (2020.08); *C09J 2301/204* (2020.08); *C09J 2301/302* (2020.08); *C09J 2400/28* (2013.01); *C09J 2467/008* (2013.01); *C09J 2483/006* (2013.01); *Y10T 428/14* (2015.01)

(58) Field of Classification Search
CPC .... H05K 5/069; H05K 5/0017; H05K 5/0095; C09J 7/25; C09J 7/405; C09J 7/38; C09J 7/20; C09J 7/22; C09J 7/40; C09J 2301/124; C09J 2301/302; C09J 2301/204; C09J 2203/326; C09J 2400/28; C09J 2467/008; C09J 2483/006; B29C 71/0009; B29C 2071/0045; G07G 1/0018; Y10T 428/14; B29K 2083/00; B29L 2031/3481; B29L 2031/466
See application file for complete search history.

(56) References Cited

U.S. PATENT DOCUMENTS

| | | | | |
|---|---|---|---|---|
| 4,436,965 | A * | 3/1984 | Morse | ...... H04M 1/23 |
| | | | | 200/302.2 |
| 9,582,040 | B2 * | 2/2017 | Leonhard | ...... G06F 1/1637 |

(Continued)

*Primary Examiner* — Patricia L. Nordmeyer
(74) *Attorney, Agent, or Firm* — WPAT, PC

(57) ABSTRACT

A protective cover assembly and a protected electronic device are provided. The protective cover assembly for example includes: a silicone base, having an inner surface and an outer surface opposite to the inner surface; a patterned double-sided adhesive layer, attached onto the inner surface of the silicone base; and a releasable protective paper, attached onto a side of the patterned double-sided adhesive layer facing away from the inner surface of the silicone base and thereby the patterned double-sided adhesive layer is sandwiched between the silicone base and the releasable protective paper. The protective cover assembly can be applied for protecting a keypad and/or display part of an electronic device to thereby make the protected electronic device gain a liquid sealing and corrosion-resistant performance and the service life is prolonged consequently.

5 Claims, 17 Drawing Sheets

(51) Int. Cl.
  *B29K 83/00* (2006.01)
  *B29L 31/34* (2006.01)
  *B29L 31/46* (2006.01)

(56) References Cited

U.S. PATENT DOCUMENTS

2008/0011838 A1* 1/2008 Henry .................... G07G 1/14
                                                    235/383
2011/0274871 A1* 11/2011 Van Drie ................. C09J 7/20
                                                    428/99
2013/0142981 A1* 6/2013 Huang .................... C09J 7/30
                                                    428/41.8

* cited by examiner

PROTECTIVE COVER ASSEMBLY AND PROTECTED ELECTRONIC DEVICE

TECHNICAL FIELD

The invention relates to the field of electronic device liquid sealing and erosion prevention, and more particularly to a protective cover assembly and a protected electronic device.

DESCRIPTION OF RELATED ART

An electronic device such as a point-of-sales (POS) device generally is equipped with a keypad and a display part having a display screen. Water, disinfectant, alcohol, acid, etc. would easily enter the inside of the POS device via a gap surrounding a key of the keypad and/or a gap surrounding the display part and corrodes the POS device, which would cause the POS device to malfunction, and its service life is shortened consequently.

SUMMARY

Accordingly, objectives of the invention are to provide a protective cover assembly and a protected electronic device.

In an aspect, an embodiment of the invention provides a protective cover assembly including: a silicone base, a patterned double-sided adhesive layer and a releasable protective paper. The silicone base has an inner surface and an outer surface opposite to the inner surface. The patterned double-sided adhesive layer is attached onto the inner surface of the silicone base. The releasable protective paper is attached onto a side of the patterned double-sided adhesive layer facing away from the inner surface of the silicone base, and thereby the patterned double-sided adhesive layer is sandwiched between the silicone base and the releasable protective paper.

In an embodiment, the silicone base includes a central region and a ring-shaped peripheral region surrounding the central region, and the ring-shaped peripheral region has the patterned double-sided adhesive layer located therein.

In an embodiment, the central region is disposed with a plurality of key-accommodation protrusions protruded from the outer surface and spaced from one another.

In an embodiment, the patterned double-sided adhesive layer includes a ring-shaped adhesive portion and at least one bar-shaped adhesive portion, and two opposite ends of each of the at least one bar-shaped adhesive portion are connected with the ring-shaped adhesive portion; the ring-shaped adhesive portion is located in the ring-shaped peripheral region of the silicone base, the at least one bar-shaped adhesive portion is located in the central region and demarcates the central region into a plurality of non-adhesive sub-regions, and the plurality of key-accommodation protrusions are distributed in the plurality of non-adhesive sub-regions.

In an embodiment, the central region is an empty region and thereby the silicone base is ring-shaped.

In an embodiment, the protective cover assembly further includes: a screen protective film, a ring-shaped double-sided adhesive layer and a second releasable protective paper. The ring-shaped double-sided adhesive layer is attached onto the screen protective film. The second releasable protective paper is attached onto the ring-shaped double-sided adhesive layer and thereby the ring-shaped double-sided adhesive layer is sandwiched between the screen protective film and the second releasable protective paper. The silicone base is configured (i.e., structured and arranged) for covering outer edges of the screen protective film, and being attached onto the screen protective film by the patterned double-sided adhesive layer after removing the releasable protective paper attached onto the side of the patterned double-sided adhesive layer.

In an embodiment, the screen protective film has a hardness of pencil hardness 4H, and the screen protective film is made of polyethylene terephthalate (PET).

In another aspect, an embodiment of the invention provides a protected electronic device including: a target electronic device, and at least one of a first protective cover assembly and a second protective cover assembly. The target electronic device is equipped with a keypad and a display part having a display screen. The first protective cover assembly includes: a first silicone base and a first patterned double-sided adhesive layer. The first silicone base has an inner surface and an outer surface opposite to the inner surface. The first patterned double-sided adhesive layer is attached onto the inner surface of the first silicone base. The first silicone base is configured for being attached onto the target electronic device by the first patterned double-sided adhesive layer to thereby cover and seal the keypad. The second protective cover assembly includes: a second silicone base, a second patterned double-sided adhesive layer, a screen protective film and a ring-shaped double-sided adhesive layer. The second silicone base has an inner surface and an outer surface opposite to the inner surface. The second patterned double-sided adhesive layer is attached onto the inner surface of the second silicone base. The ring-shaped double-sided adhesive layer is attached onto the screen protective film. The screen protective film is configured for being attached onto the display part by the ring-shaped double-sided adhesive layer to cover the display screen. The second silicone base is configured for being attached onto the target electronic device and the screen protective film by the second patterned double-sided adhesive layer to cover outer edges of the screen protective film, and being cooperative with the screen protective film to cover and seal the display part.

In an embodiment, the first silicone base includes a central region and a ring-shaped peripheral region surrounding the central region, and the ring-shaped peripheral region has the first patterned double-sided adhesive layer located therein.

In an embodiment, the central region is disposed with a plurality of key-accommodation protrusions protruded from the outer surface and spaced from one another, and a plurality of keys of the keypad are received in the plurality of key-accommodation protrusions respectively.

In an embodiment, the patterned double-sided adhesive layer includes a ring-shaped adhesive portion and at least one bar-shaped adhesive portion, and two opposite ends of each of the at least one bar-shaped adhesive portion are connected with the ring-shaped adhesive portion; the ring-shaped adhesive portion is located in the ring-shaped peripheral region of the first silicone base, the at least one bar-shaped adhesive portion is located in the central region and demarcates the central region into a plurality of non-adhesive sub-regions, and the plurality of key-accommodation protrusions are distributed in the plurality of non-adhesive sub-regions.

In an embodiment, the second silicone base includes a central region and a ring-shaped peripheral region surrounding the central region, the ring-shaped peripheral region has the second patterned double-sided adhesive layer located therein, the central region is an empty region and thereby the second silicone base is ring-shaped.

In an embodiment, the screen protective film has a hardness of pencil hardness 4H, and the screen protective film is made of polythylene terephthalate (PET).

In an embodiment, the protected electronic device has a waterproof level up to IP68. Herein, the waterproof level IP68 is corresponding to that a under test device is impermeable after being placed underwater in a depth of two meters for two hours.

In still another aspect, an embodiment of the invention provides a manufacturing method of a protective cover assembly, including: (i) forming a silicone base by molding, the silicone base having an inner surface and an outer surface opposite to the inner surface; (ii) cleaning the inner surface of the silicone base by a processed water; (iii) attaching a patterned double-sided adhesive layer onto the inner surface of the silicone base after the cleaning; (iv) pressing the silicone base and the patterned double-sided adhesive layer together by a tool for a time length equal to or greater than 0.5 minutes to discharge air between the silicone base and the patterned double-sided adhesive layer; and (v) attaching a releasable protective paper onto a side of the patterned double-sided adhesive layer facing away from the inner surface of the silicone base, after removing the tool.

In an embodiment, the silicone base includes a central region and a ring-shaped peripheral region surrounding the central region, and the ring-shaped peripheral region has the patterned double-sided adhesive layer located therein.

In an embodiment, the central region is disposed with a plurality of key-accommodation protrusions protruded from the outer surface and spaced from one another.

In an embodiment, the patterned double-sided adhesive layer includes a ring-shaped adhesive portion and at least one bar-shaped adhesive portion, and two opposite ends of each of the at least one bar-shaped adhesive portion are connected with the ring-shaped adhesive portion; the ring-shaped adhesive portion is located in the ring-shaped peripheral region of the silicone base, the at least one bar-shaped adhesive portion is located in the central region and demarcates the central region into a plurality of non-adhesive sub-regions, and the plurality of key-accommodation protrusions are distributed in the plurality of non-adhesive sub-regions.

In an embodiment, the central region is an empty region and thereby the silicone base is ring-shaped.

In an embodiment, the time length is in a range of 0.5-3 minutes.

Sum up, the invention provides a protective cover assembly including a silicone base and a patterned double-sided adhesive layer attached onto the inner surface of the silicone base in an impermeable manner, the silicone base itself is oil-resistant, water-resistant and corrosion-resistant, and when it is applied onto a target electronic device by adhesiveness of the patterned double-sided adhesive layer, the keypad and/or the display part of the target electronic device would gain a liquid sealing and corrosion-resistant performance and thereby the target electronic device is protected and its service life is prolonged consequently.

BRIEF DESCRIPTION OF THE DRAWINGS

In order to more clearly illustrate technical solutions of embodiments of the invention or the prior art, drawings used in the description of the embodiments or the prior art will be briefly described below.

DETAILED DESCRIPTION OF EMBODIMENTS

The technical solutions in the embodiments of the invention will be clearly and completely described below, with reference to the accompanying drawings in the embodiments of the invention.

Embodiment 1

Figure 1A:
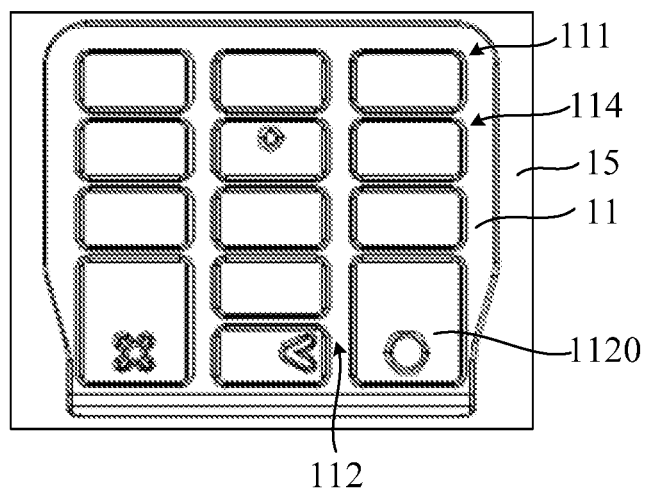
FIG. 1A is a schematic top view of a keypad protective cover assembly according to an embodiment of the invention.
Figure 1B:
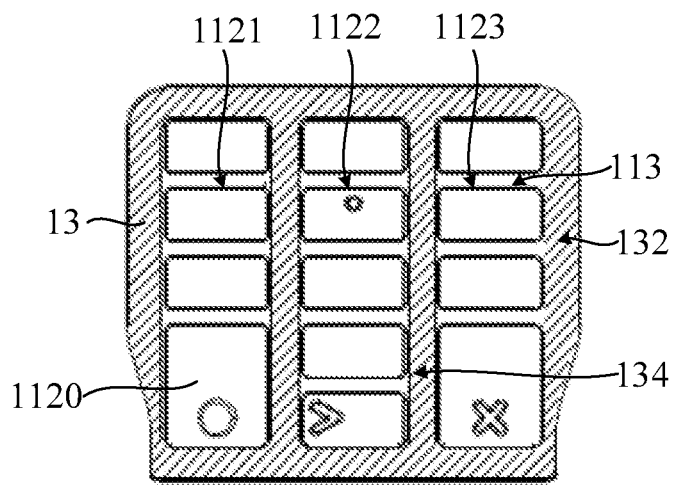
FIG. 1B is a schematic bottom view of the keypad protective cover assembly shown in FIG. 1A without showing the releasable protective paper.
Figure 1C:
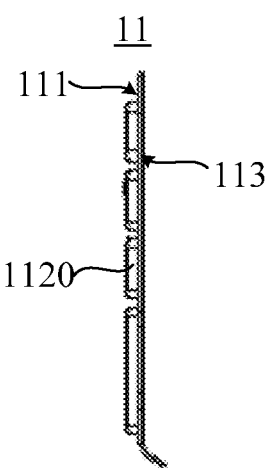
FIG. 1C is a schematic side view of the silicone base shown in FIG. 1A.

Referring to FIG. 1A, FIG. 1B and FIG. 1C, a protective cover assembly such as a keypad protective cover assembly 10 includes a silicone base 11, a patterned double-sided adhesive layer 13 and a releasable protective paper 15.

The silicone base 11 has an inner surface 113 and an outer surface 111 opposite to the inner surface 113. The silicone base 11 is exemplarily made of a silicone material and typically is transmissive to visible light.

The patterned double-sided adhesive layer 13 is attached onto the inner surface 113 of the silicone base 11. The patterned double-sided adhesive layer 13 is exemplarily a 3M double-sided adhesive tape.

The releasable protective paper 15 is attached onto a side of the patterned double-sided adhesive layer 13 facing away from the inner surface 113 of the silicone base 11 and thereby the patterned double-sided adhesive layer 13 is sandwiched between the silicone base 11 and the releasable protective paper 15.

As illustrated in FIG. 1A and FIG. 1B, the silicone base 11 includes a central region 112 and a ring-shaped peripheral region 114 surrounding the central region 112. The ring-shaped peripheral region 114 has the patterned double-sided adhesive layer 13 located therein. The central region 112 is disposed with a plurality of key-accommodation protrusions 1120 protruded from the outer surface 111 and spaced from one another (see FIG. 1C).

Moreover, the patterned double-sided adhesive layer 13 includes a ring-shaped adhesive portion 132 and at least one bar-shaped adhesive portion 134 (FIG. 1B shows two bar-shaped adhesive portions 134 as an example), and two opposite ends of each of the at least one bar-shaped adhesive portion 134 are connected with the ring-shaped adhesive portion 132. The ring-shaped adhesive portion 132 is located in the ring-shaped peripheral region 114 of the silicone base 11, the at least one bar-shaped adhesive portion 134 is located in the central region 112 and demarcates the central region 112 into a plurality of non-adhesive sub-regions 1121, 1122, 1123. The plurality of key-accommodation protrusions 1120 are distributed in the plurality of non-adhesive sub-regions 1121, 1122, 1123.

In summary, the keypad protective cover assembly 10 as illustrated in FIG. 1A-1C includes the silicone base 11 and the patterned double-sided adhesive layer 13 attached onto the inner surface 113 of the silicone base 11 in an impermeable manner, the silicone base 11 itself is oil-resistant, water-resistant and corrosion-resistant, and when it is applied onto a target electronic device by adhesiveness of the patterned double-sided adhesive layer 13, the keypad of the target electronic device would gain a liquid sealing and corrosion-resistant performance and thereby the target electronic device is protected and its service life is prolonged consequently. Moreover, the bar-shaped adhesive portion 134 would make the silicone base 11 be more firmly attached onto the target electronic device, and the reliability of adhesiveness is improved consequently.

Embodiment 2

Figure 2A:
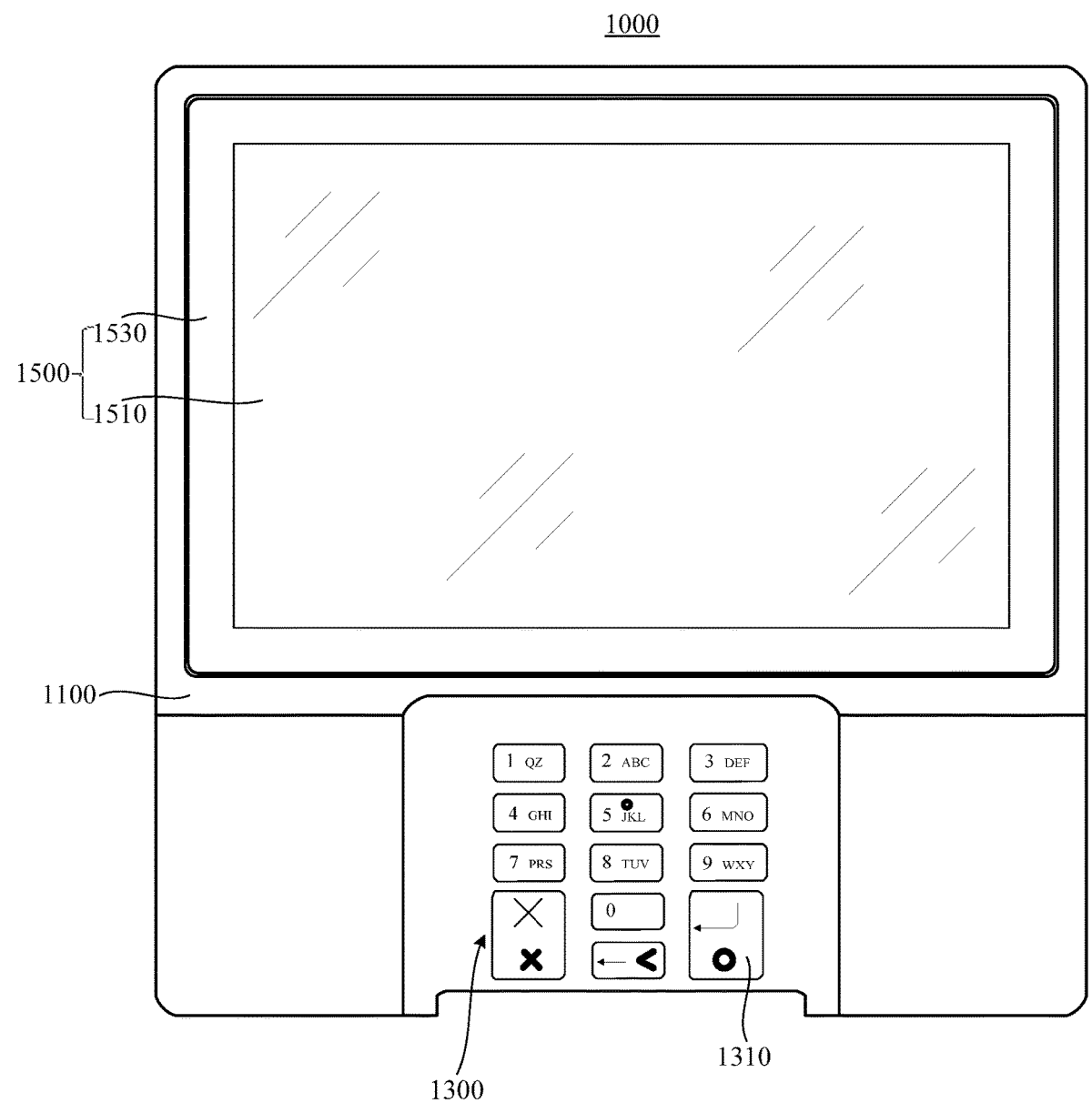
FIG. 2A is a schematic structural view of a target electronic device according to an embodiment of the invention.
Figure 2B:
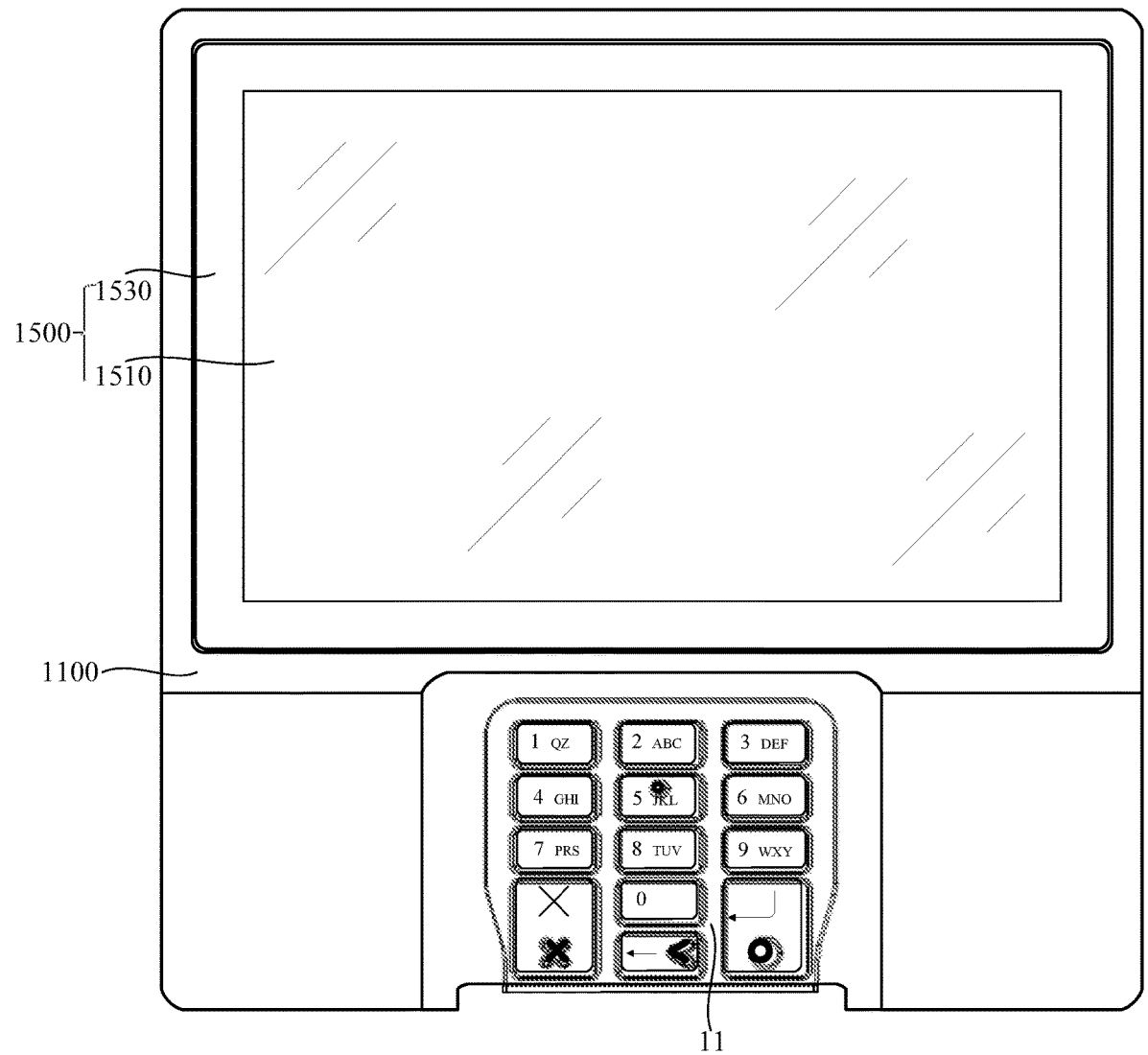
FIG. 2B is a schematic structural view of a protected electronic device using the keypad protective cover assembly shown in FIG. 1A.

Referring to FIGS. 2A and 2B, a protected electronic device illustrated in FIG. 2B includes a target electronic device 1000 using the keypad protective cover assembly 10 shown in FIG. 1A-1C.

In particular, as illustrated in FIG. 2A, the target electronic device 1000 includes a main body 1100, a keypad 1300 and a display part 1500. The keypad 1300 is disposed on the main body 1100 and includes a plurality of keys 1310. As well-known that a gap usually exists between each key 1310 and the main body 1100, and surrounds the key 1310.

Moreover, the display part 1500 is disposed on the main body 1100 and includes a display screen 1510 and a peripheral portion 1530 surrounding the display screen 1510. Similarly, a gap usually exists between the display part 1500 and the main body 1100, and surrounds the display part 1500.

Water, disinfectant, alcohol, acid, etc. would easily enter the inside of the target electronic device 1000 such as a POS device in use via the gap surrounding the key 1310 of the keypad 1300 and/or the gap surrounding the display part 1500 and corrodes the target electronic device 1000, which would cause the target electronic device 1000 to malfunction. Therefore, as illustrated in FIG. 2B, the keypad protective cover assembly 10 as shown in FIG. 1A is used, and after removing the releasable protective paper 15, the silicone base 11 is attached onto the main body 1100 of the target electronic device 1000 by the patterned double-sided adhesive layer 13 to thereby cover and seal the keypad 1300, and the plurality of keys 1310 of the keypad 1300 are received in the plurality of key-accommodation protrusions 1120 (see FIG. 1C) respectively.

Embodiment 3

Referring to FIG. 3A-3E, a protective cover assembly such as display protective cover assembly includes: a silicone base 31, a patterned double-sided adhesive layer 33, a releasable protective paper 35, a screen protective film 37, a ring-shaped double-sided adhesive layer 38 and a second releasable protective paper 39. In the illustrated embodiment, the silicone base 31, the patterned double-sided adhesive layer 33 and the releasable protective paper 35 together constitute a sealing member of the display protective cover assembly; and the screen protective film 37, the ring-shaped double-sided adhesive layer 38 and the second releasable protective paper 39 together constitute a screen protecting member of the display protective cover assembly.

Figure 3A:
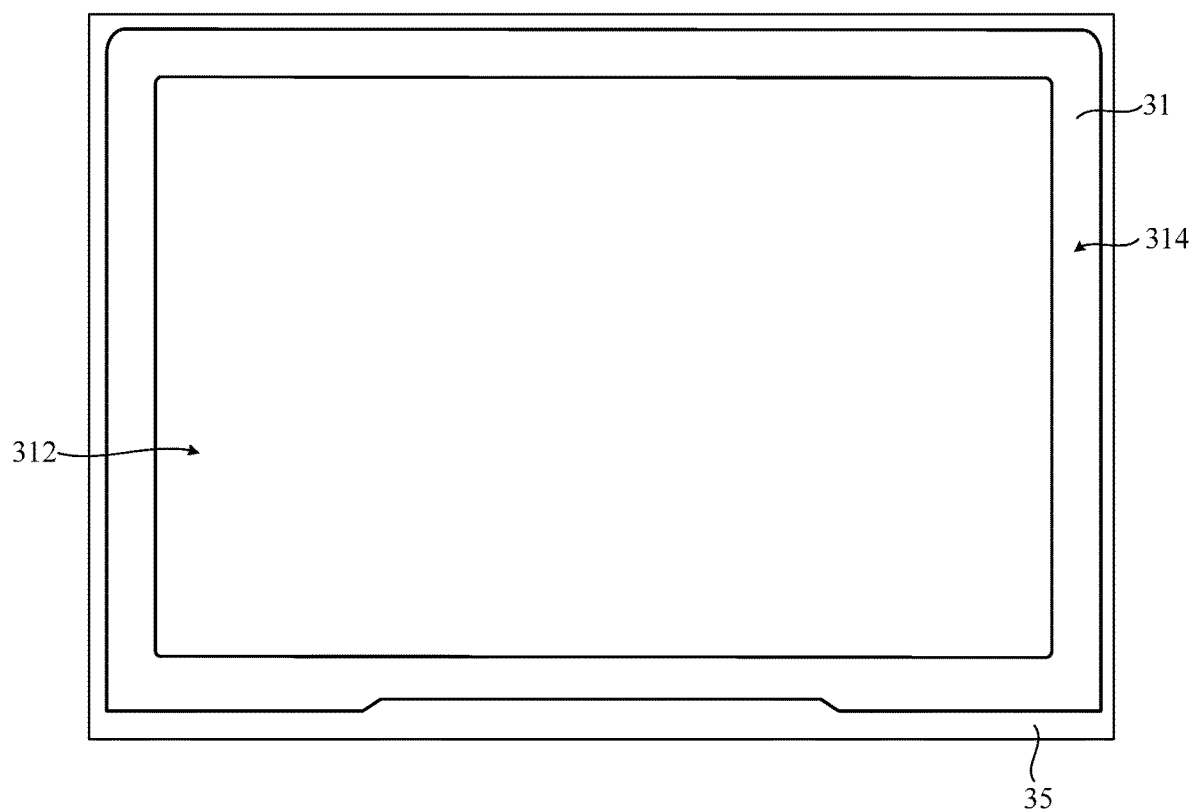
FIG. 3A is a schematic top view of a sealing member of a display protective cover assembly according to an embodiment of the invention.
Figure 3B:
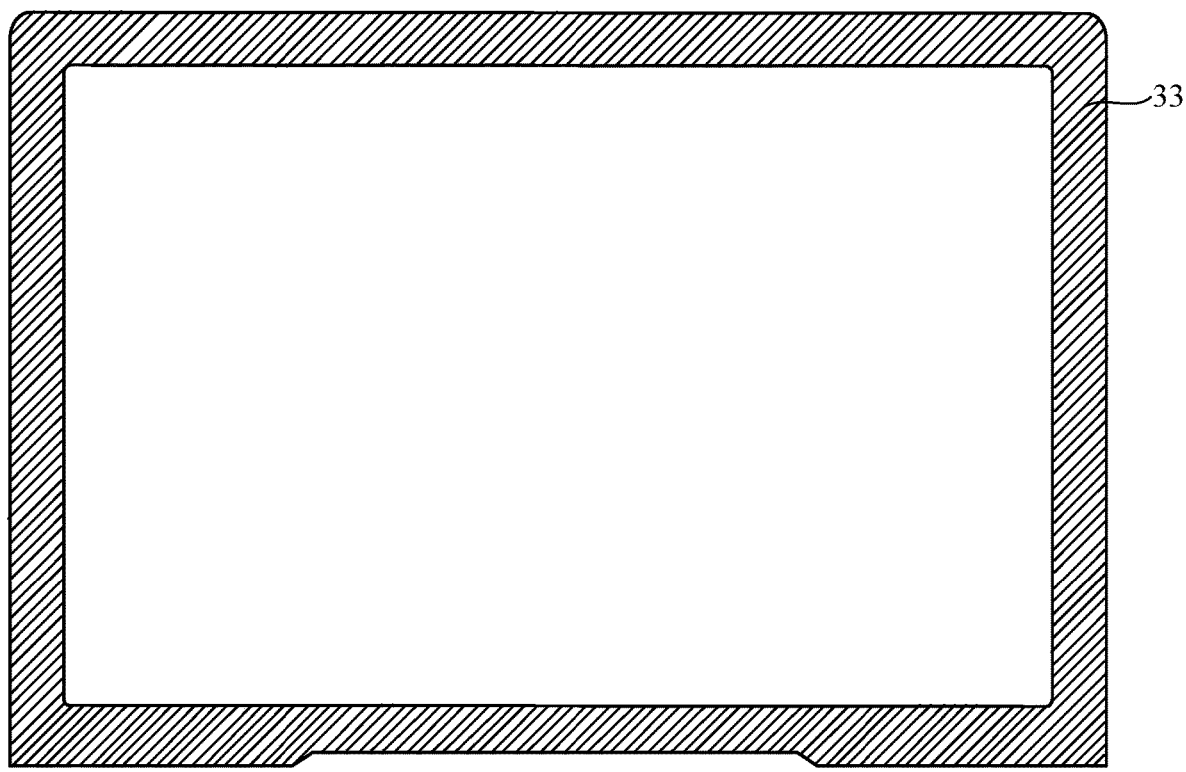
FIG. 3B is a schematic bottom view of the sealing member of the display protective cover assembly shown in FIG. 3A without showing the releasable protective paper.

As illustrated in FIG. 3A and FIG. 3B, the patterned double-sided adhesive layer 33 is sandwiched between the silicone base 31 and the releasable protective paper 35. The silicone base 31 is exemplarily made of a silicone material and typically is transmissive to visible light. More specifically, the silicone base 31 includes a central region 312 and a ring-shaped peripheral region 314 surrounding the central region 312, and the ring-shaped peripheral region 314 has the patterned double-sided adhesive layer 33 located therein. The central region 312 is an empty region rather than non-empty region like the illustration in FIG. 1A-1C, and therefore the silicone base 31 is ring-shaped. Correspondingly, the patterned double-sided adhesive layer 33 is ring-shaped. In addition, the patterned double-sided adhesive layer 33 is exemplarily a 3M double-sided adhesive tape.

Figure 3C:
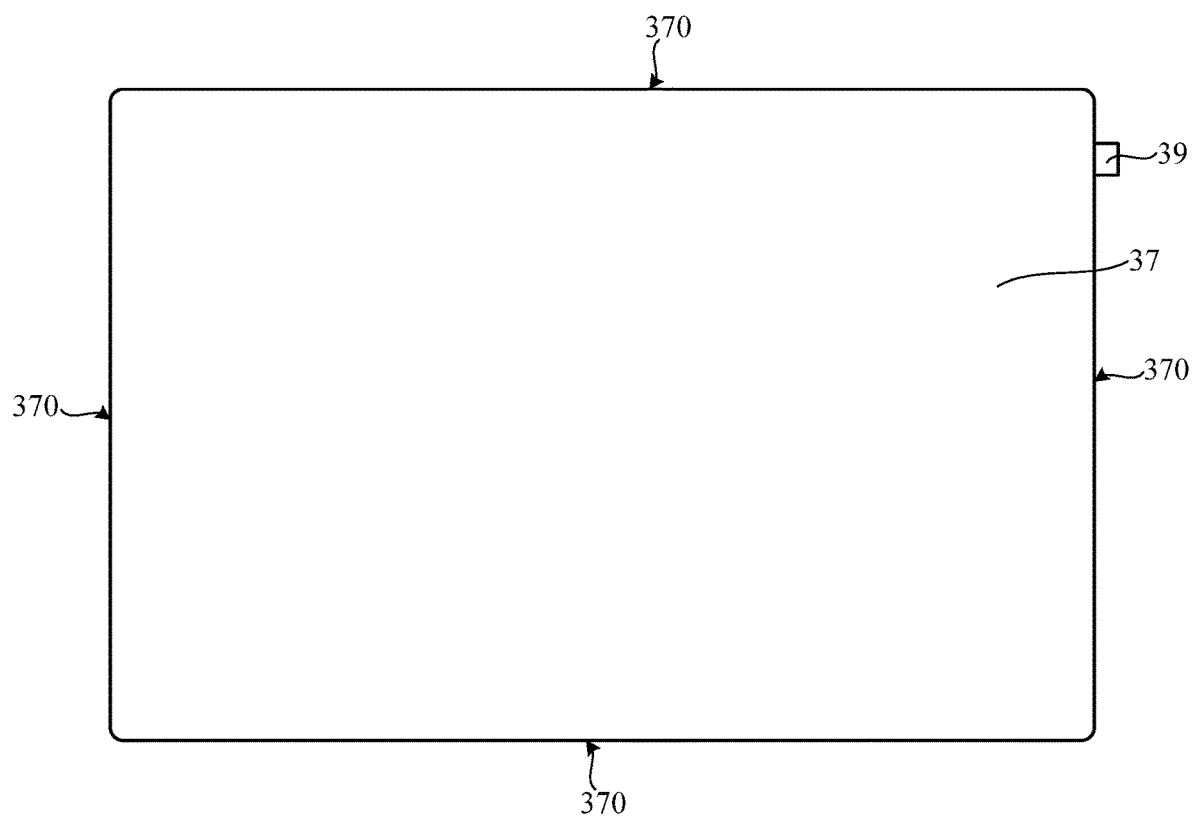
FIG. 3C is a schematic top view of a screen protecting member of the display protective cover assembly according to an embodiment of the invention.
Figure 3D:
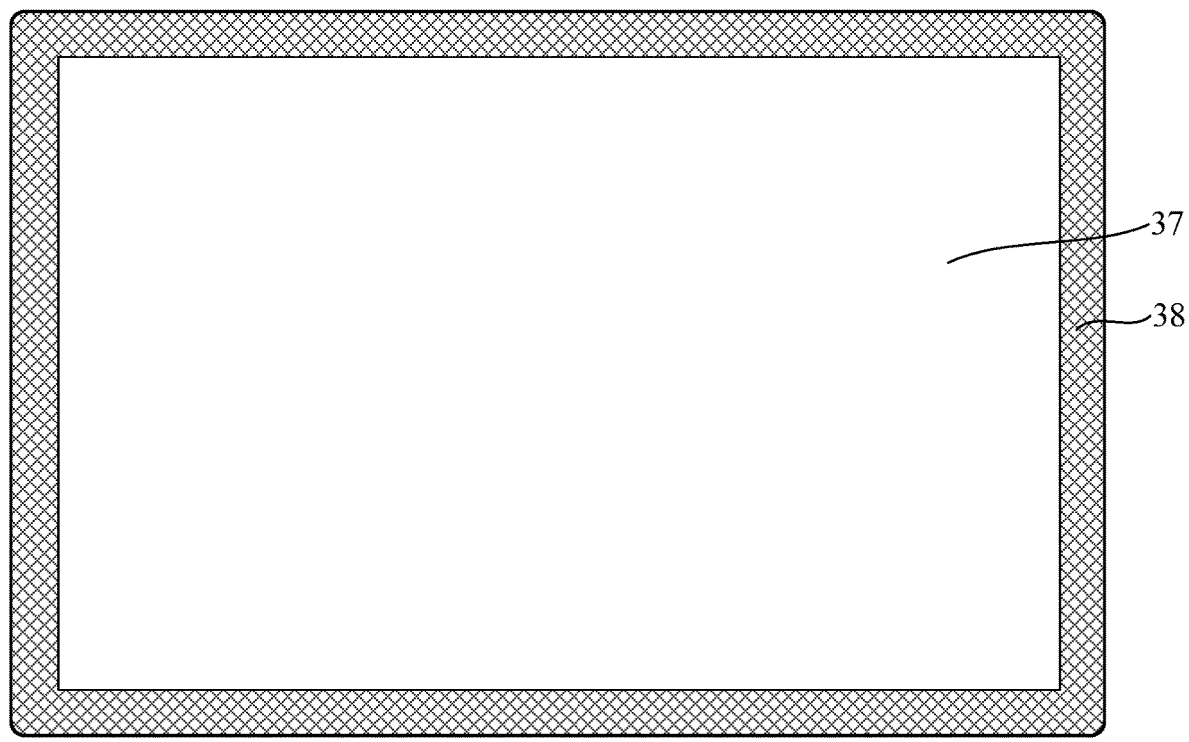
FIG. 3D is a schematic bottom view of the screen protecting member of the display protective cover assembly shown in FIG. 3C without showing the second releasable protective paper.
Figure 3E:
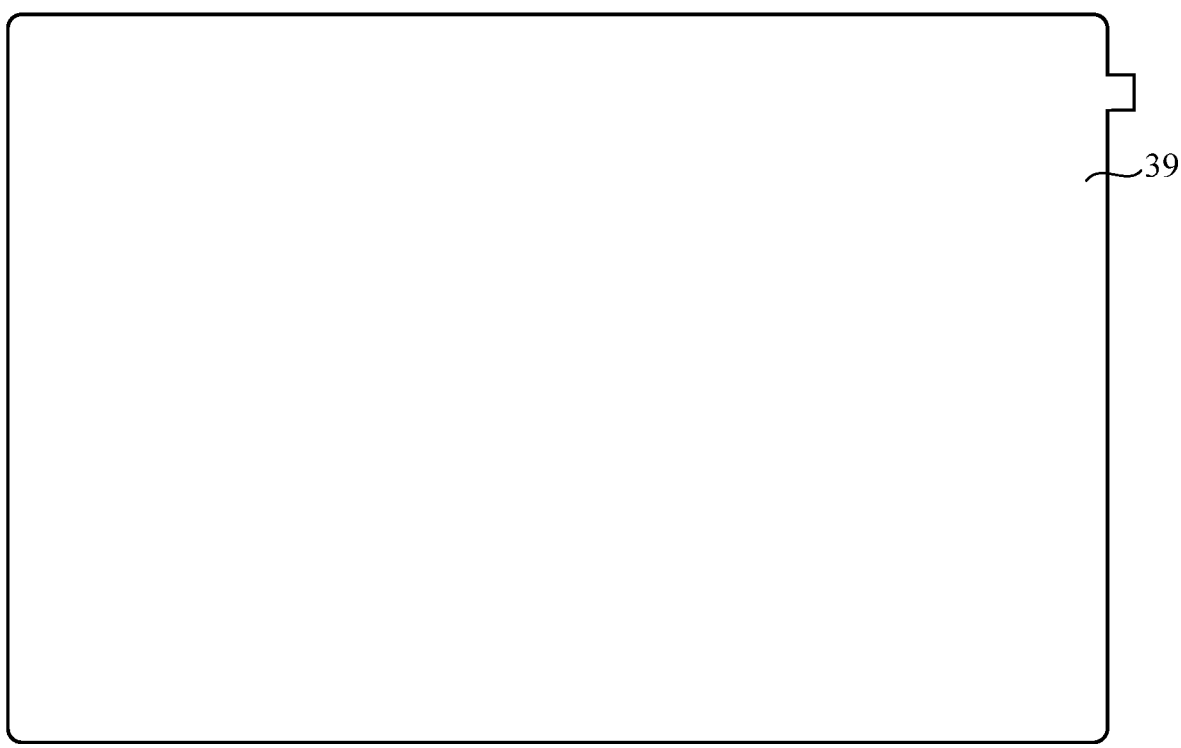
FIG. 3E is a schematic structural view of the second releasable protective paper shown in FIG. 3C.

As illustrated in FIG. 3C-3E, the ring-shaped double-sided adhesive layer 38 is attached onto the screen protective film 37, the second releasable protective paper 39 is attached onto the ring-shaped double-sided adhesive layer 38 and thereby the ring-shaped double-sided adhesive layer 38 is sandwiched between the screen protective film 37 and the second releasable protective paper 39. Exemplarily, the screen protective film 37 is made of polyethylene terephthalate (PET) and has a harness of pencil hardness 4H, the ring-shaped double-sided adhesive layer 38 is a 3M double-sided adhesive tape, the second releasable protective paper 39 is formed with a tab for facilitating the removing of the second releasable protective paper 39 from the ring-shaped double-sided adhesive layer 38, and the screen protective film 37 has outer edges 370 at its four sides of up, down, left and right.

In addition, the silicone base 31 is configured for covering outer edges 370 of the screen protective film 37, and being attached onto the screen protective film 37 by the patterned double-sided adhesive layer 33 after removing the releasable protective paper 35 attached onto the patterned double-sided adhesive layer 33.

In summary, the display protective cover assembly as illustrated in FIG. 3A-3E includes the silicone base 31, the patterned double-sided adhesive layer 33 attached onto the silicone base 31, the screen protective film 37 and the ring-shaped double-sided adhesive layer 38, the silicone base 31 and the screen protective film 37 themselves are oil-resistant, water-resistant and corrosion-resistant, and when they are applied onto a target electronic device by adhesiveness of the patterned double-sided adhesive layer 33 and the ring-shaped double-sided adhesive layer 38, a display part of the target electronic device would gain a liquid sealing and corrosion-resistant performance and thereby the target electronic device is protected and its service life is prolonged consequently.

Embodiment 4

Figure 4:
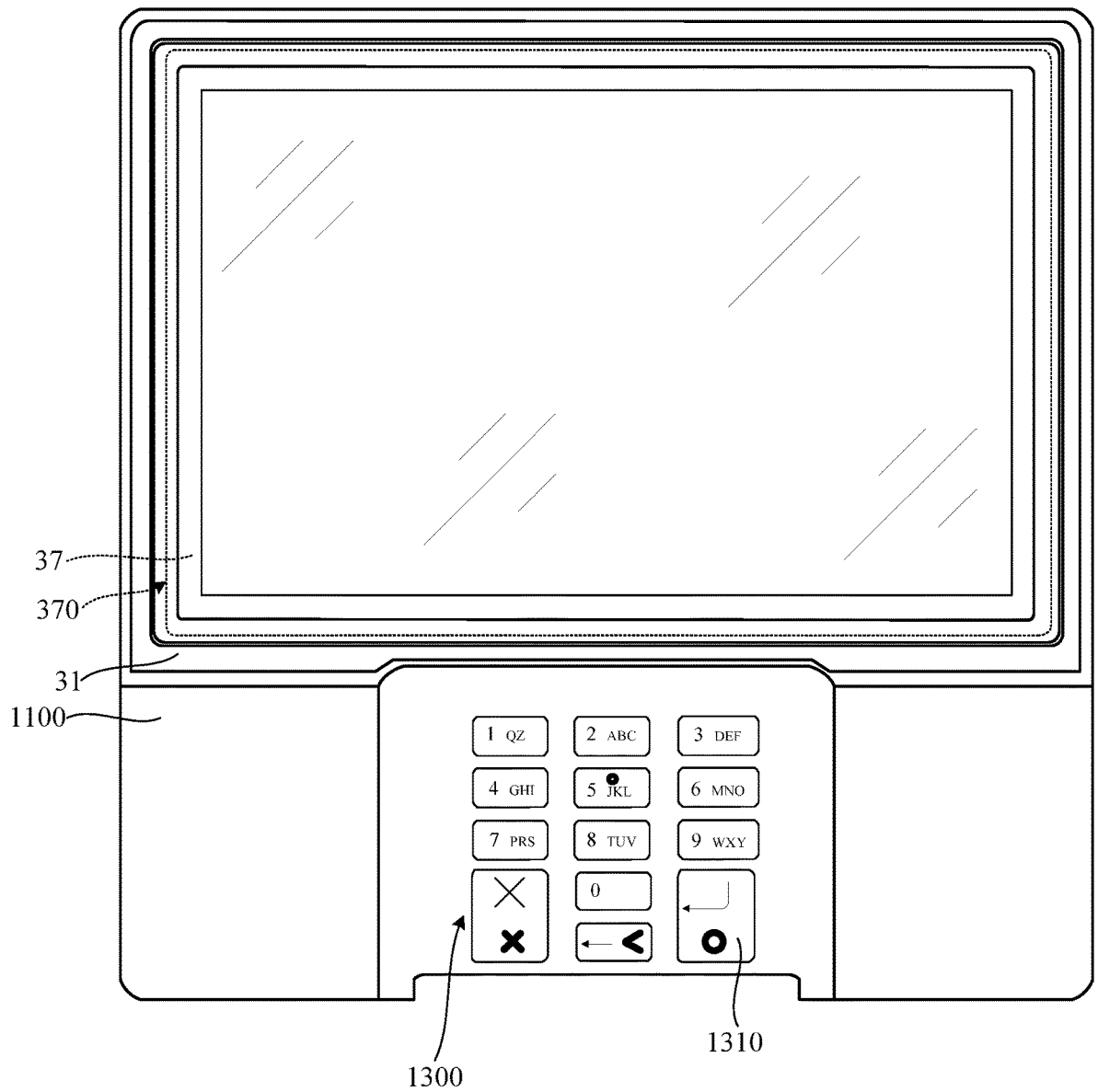
FIG. 4 is a schematic structural view of a protected electronic device using the display protective cover assembly shown in FIG. 3A and FIG. 3C.

Referring to FIG. 4 and FIG. 2A, a protected electronic device includes the target electronic device 1000 as shown in FIG. 2A using the display protective cover assembly shown in FIG. 3A-3E.

In particular, as illustrated in FIG. 2A, the target electronic device 1000 includes a main body 1100, a keypad 1300 and a display part 1500. The keypad 1300 is disposed on the main body 1100 and includes a plurality of keys 1310. As well-known that a gap usually exists between each key 1310 and the main body 1100, and surrounds the key 1310.

Moreover, the display part 1500 is disposed on the main body 1100 and includes a display screen 1510 and a peripheral portion 1530 surrounding the display screen 1510. Similarly, a gap usually exists between the display part 1500 and the main body 1100, and surrounds the display part 1500.

Water, disinfectant, alcohol, acid, etc. would easily enter the inside of the target electronic device 1000 such as a POS device in use via the gap surrounding the key 1310 of the keypad 1300 and/or the gap surrounding the display part 1500 and corrodes the target electronic device 1000, which would cause the target electronic device 1000 to malfunction. Therefore, as illustrated in FIG. 4, the display protective cover assembly as shown in FIG. 3A-3E is used, and after removing the second releasable protective paper 39, the screen protective film 37 is attached onto the display part 1500 by the ring-shaped double-sided adhesive layer 38 to cover the display screen 1510, and the ring-shaped double-sided adhesive layer 38 is adhered onto the peripheral portion 1530. Afterwards, after removing the releasable protective paper 35, the silicone base 31 is attached onto the main body 1100 of the target electronic device 1000 and the screen protective film 37 by the patterned double-sided adhesive layer 33 to cover the outer edges 370 of the screen protective film 37, and cooperative with the screen protective film 37 to cover and seal the display part 1500. As a result, the service life of the protected electronic device is prolonged.

Embodiment 5

Figure 5:
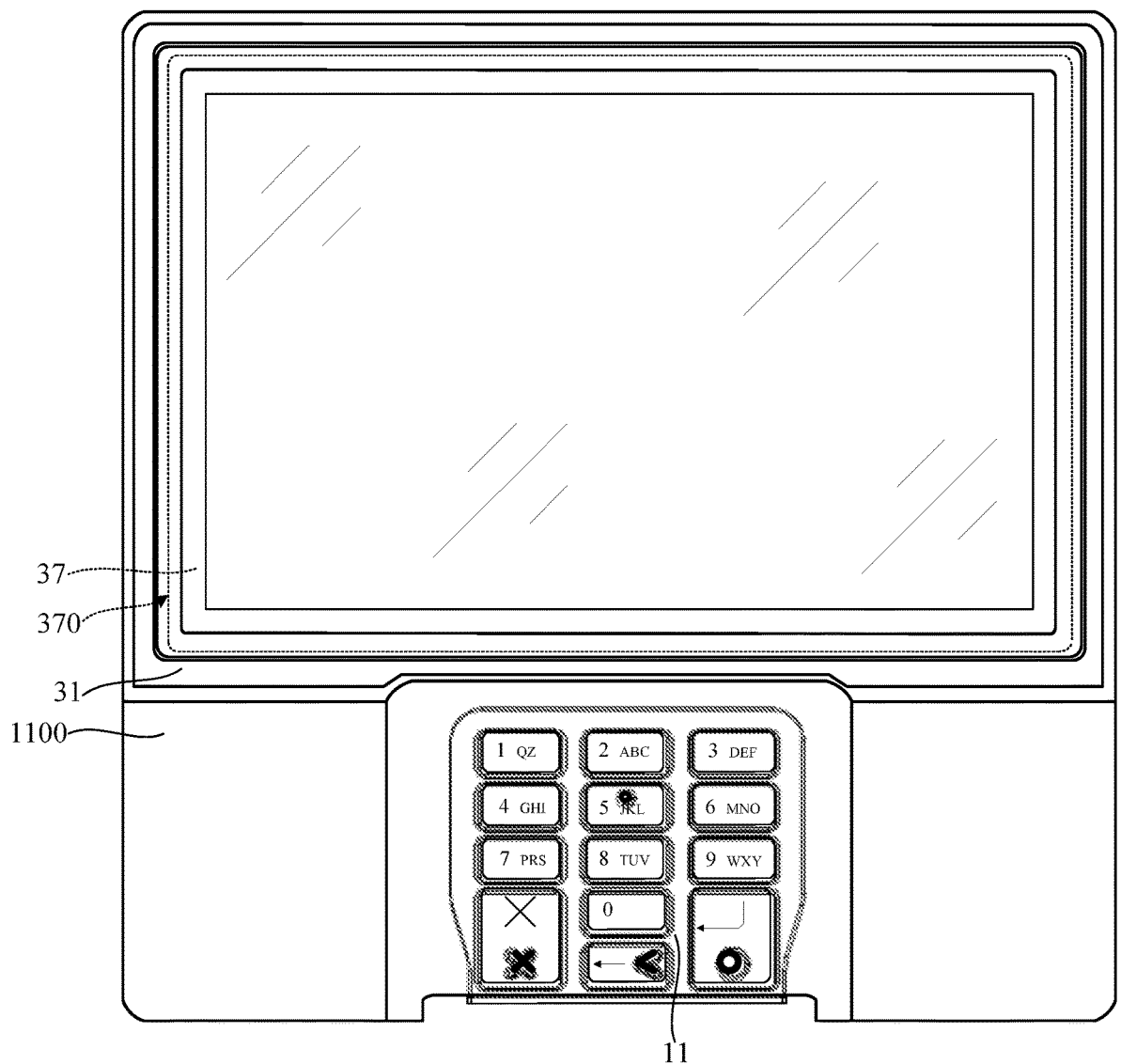
FIG. 5 is a schematic structural view of a protected electronic device using the keypad protective cover assembly shown in FIG. 1A and using the display protective cover assembly shown in FIG. 3A and FIG. 3C.

Referring to FIG. 5, a protected electronic device includes the target electronic device 1000 as shown in FIG. 2A using the display protective cover assembly shown in FIG. 3A-3E and using the keypad protective cover assembly shown in FIG. 1A-1C. Regarding the detailed structure of the protected electronic device, please refer to the descriptions associated with the above Embodiment 2 and Embodiment 4, and thus will not be repeated.

Embodiment 6

Figure 6A:
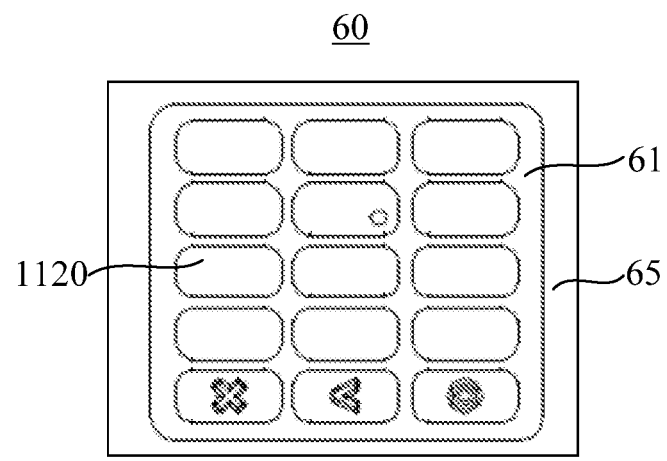
FIG. 6A is a schematic top view of a keypad protective cover assembly according to an embodiment of the invention.
Figure 6B:
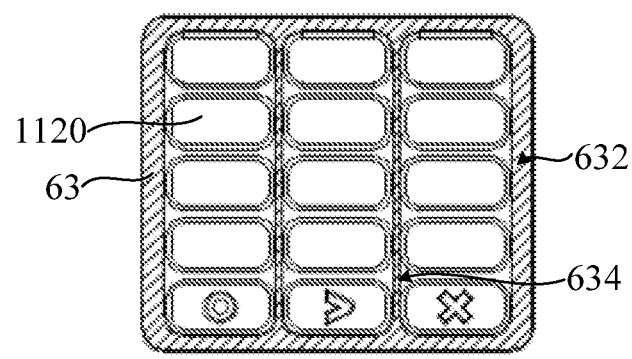
FIG. 6B is a schematic bottom view of the keypad protective cover assembly shown in FIG. 6A without showing the releasable protective paper.

Referring to FIG. 6A and FIG. 6B, a keypad protective cover assembly 60 includes a silicone base 61, a patterned double-sided adhesive layer 63 and a releasable protective paper 65.

The silicone base 61 has an inner surface and an outer surface opposite to the inner surface. The silicone base 61 is exemplarily made of a silicone material and typically is transmissive to visible light.

The patterned double-sided adhesive layer 63 is attached onto the inner surface of the silicone base 61. The patterned double-sided adhesive layer 63 is exemplarily a 3M double-sided adhesive tape.

The releasable protective paper 65 is attached onto a side of the patterned double-sided adhesive layer 63 facing away from the inner surface of the silicone base 61 and thereby the patterned double-sided adhesive layer 63 is sandwiched between the silicone base 61 and the releasable protective paper 65.

As illustrated in FIG. 6A and FIG. 6B, the silicone base 61 includes a central region and a ring-shaped peripheral region surrounding the central region. The ring-shaped peripheral region has the patterned double-sided adhesive layer 63 located therein. The central region is disposed with a plurality of key-accommodation protrusions 1120 protruded from the outer surface and spaced from one another.

Moreover, the patterned double-sided adhesive layer 63 includes a ring-shaped adhesive portion 632 and two bar-shaped adhesive portions 634, and two opposite ends of each bar-shaped adhesive portion 634 are connected with the ring-shaped adhesive portion 632. The ring-shaped adhesive portion 632 is located in the ring-shaped peripheral region of the silicone base 61, the two bar-shaped adhesive portions 634 are located in the central region and demarcate the central region into three non-adhesive sub-regions. The plurality of key-accommodation protrusions 1120 are distributed in the three non-adhesive sub-regions. In addition, different from the illustration of FIG. 1A-1C, the silicone base 61 has a profile of rectangle with rounded corners.

Embodiment 7

Figure 7A:
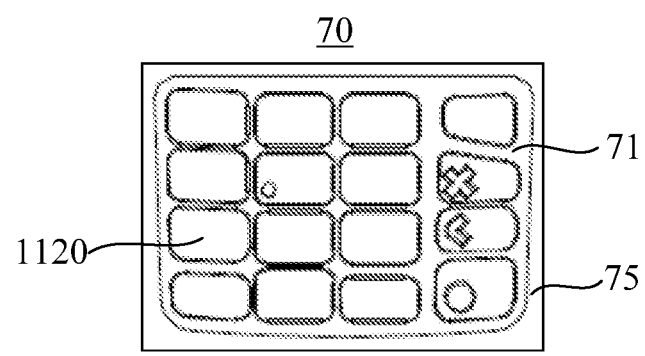
FIG. 7A is a schematic top view of a keypad protective cover assembly according to an embodiment of the invention.
Figure 7B:
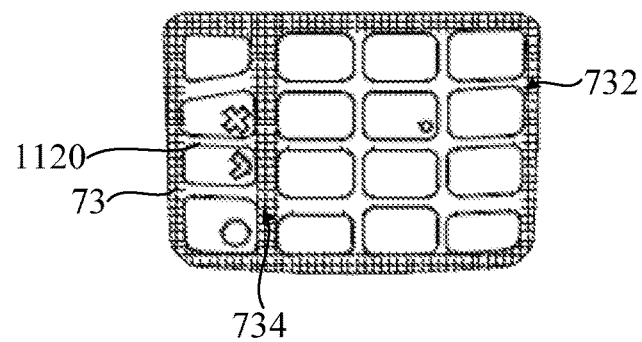
FIG. 7B is a schematic bottom view of the keypad protective cover assembly shown in FIG. 7A without showing the releasable protective paper.

Referring to FIG. 7A and FIG. 7B, a keypad protective cover assembly 70 includes a silicone base 71, a patterned double-sided adhesive layer 73 and a releasable protective paper 75.

The silicone base 71 has an inner surface and an outer surface opposite to the inner surface. The silicone base 71 is exemplarily made of a silicone material and typically is transmissive to visible light.

The patterned double-sided adhesive layer 73 is attached onto the inner surface of the silicone base 71. The patterned double-sided adhesive layer 73 is exemplarily a 3M double-sided adhesive tape.

The releasable protective paper 75 is attached onto a side of the patterned double-sided adhesive layer 73 facing away from the inner surface of the silicone base 71 and thereby the patterned double-sided adhesive layer 73 is sandwiched between the silicone base 71 and the releasable protective paper 75.

As illustrated in FIG. 7A and FIG. 7B, the silicone base 71 includes a central region and a ring-shaped peripheral region surrounding the central region. The ring-shaped peripheral region has the patterned double-sided adhesive layer 73 located therein. The central region is disposed with a plurality of key-accommodation protrusions 1120 protruded from the outer surface and spaced from one another.

Moreover, the patterned double-sided adhesive layer 73 includes a ring-shaped adhesive portion 732 and one bar-shaped adhesive portion 734, and two opposite ends of the bar-shaped adhesive portion 734 are connected with the ring-shaped adhesive portion 732. The ring-shaped adhesive portion 732 is located in the ring-shaped peripheral region of the silicone base 71, the bar-shaped adhesive portion 734 is located in the central region and demarcates the central region into two non-adhesive sub-regions. The plurality of key-accommodation protrusions 1120 are distributed in the two non-adhesive sub-regions. In addition, different from the illustration of FIG. 1A-1C, the silicone base 71 has a profile of rectangle with rounded corners, and the two non-adhesive sub-regions have different numbers of key-accommodation protrusions 1120 distributed therein.

Embodiment 8

Figure 8A:
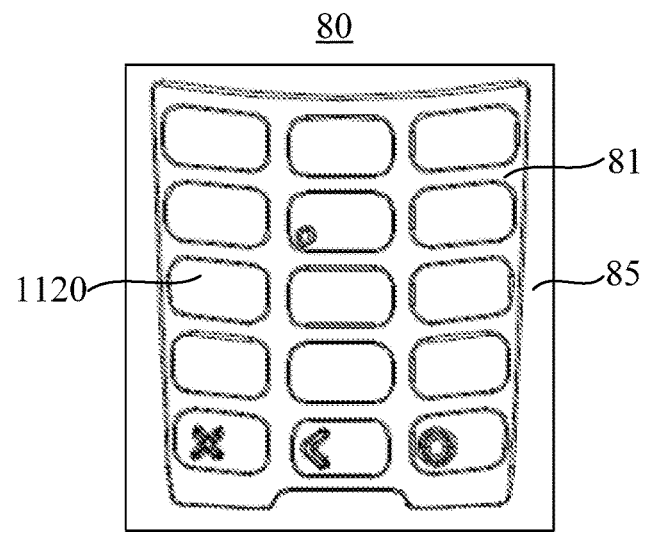
FIG. 8A is a schematic top view of a keypad protective cover assembly according to an embodiment of the invention.
Figure 8B:
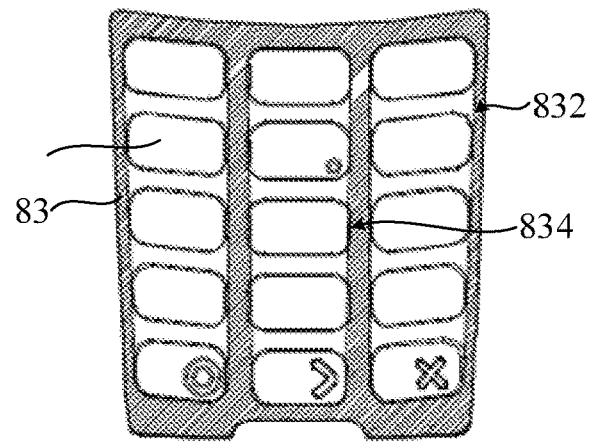
FIG. 8B is a schematic bottom view of the keypad protective cover assembly shown in FIG. 8A without showing the releasable protective paper.

Referring to FIG. 8A and FIG. 8B, a keypad protective cover assembly 80 includes a silicone base 81, a patterned double-sided adhesive layer 83 and a releasable protective paper 85.

The silicone base 81 has an inner surface and an outer surface opposite to the inner surface. The silicone base 81 is exemplarily made of a silicone material and typically is transmissive to visible light.

The patterned double-sided adhesive layer 83 is attached onto the inner surface of the silicone base 81. The patterned double-sided adhesive layer 83 is exemplarily a 3M double-sided adhesive tape.

The releasable protective paper 85 is attached onto a side of the patterned double-sided adhesive layer 83 facing away from the inner surface of the silicone base 81 and thereby the patterned double-sided adhesive layer 83 is sandwiched between the silicone base 81 and the releasable protective paper 85.

As illustrated in FIG. 8A and FIG. 8B, the silicone base 81 includes a central region and a ring-shaped peripheral region surrounding the central region. The ring-shaped peripheral region has the patterned double-sided adhesive layer 83 located therein. The central region is disposed with a plurality of key-accommodation protrusions 1120 protruded from the outer surface and spaced from one another.

Moreover, the patterned double-sided adhesive layer 83 includes a ring-shaped adhesive portion 832 and two bar-shaped adhesive portions 834, and two opposite ends of each the bar-shaped adhesive portion 834 are connected with the ring-shaped adhesive portion 832. The ring-shaped adhesive portion 832 is located in the ring-shaped peripheral region of the silicone base 81, the two bar-shaped adhesive portions 834 are located in the central region and demarcate the central region into three non-adhesive sub-regions. The plurality of key-accommodation protrusions 1120 are distributed in the three non-adhesive sub-regions. In addition, different from the illustration of FIG. 1A-1C, the silicone base 81 is curved and has a profile of trapezoid with rounded corners, and the three non-adhesive sub-regions have equal numbers of key-accommodation protrusions 1120 distributed therein.

Embodiment 9

Figure 9A:
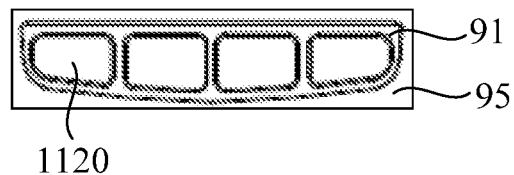
FIG. 9A is a schematic top view of a keypad protective cover assembly according to an embodiment of the invention.
Figure 9B:
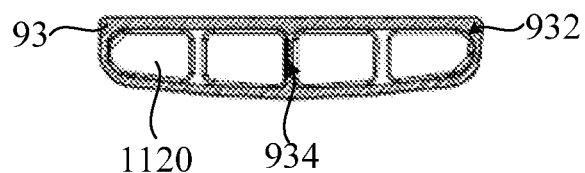
FIG. 9B is a schematic bottom view of the keypad protective cover assembly shown in FIG. 9A without showing the releasable protective paper.

Referring to FIG. 9A and FIG. 9B, a keypad protective cover assembly 90 includes a silicone base 91, a patterned double-sided adhesive layer 93 and a releasable protective paper 95.

The silicone base 91 has an inner surface and an outer surface opposite to the inner surface. The silicone base 91 is exemplarily made of a silicone material and typically is transmissive to visible light.

The patterned double-sided adhesive layer 93 is attached onto the inner surface of the silicone base 91. The patterned double-sided adhesive layer 93 is exemplarily a 3M double-sided adhesive tape.

The releasable protective paper 95 is attached onto a side of the patterned double-sided adhesive layer 93 facing away from the inner surface of the silicone base 91 and thereby the patterned double-sided adhesive layer 93 is sandwiched between the silicone base 91 and the releasable protective paper 95.

As illustrated in FIG. 9A and FIG. 9B, the silicone base 81 includes a central region and a ring-shaped peripheral region surrounding the central region. The ring-shaped peripheral region has the patterned double-sided adhesive layer 93 located therein. The central region is disposed with a plurality of key-accommodation protrusions 1120 protruded from the outer surface and spaced from one another.

Moreover, the patterned double-sided adhesive layer 93 includes a ring-shaped adhesive portion 932 and one bar-shaped adhesive portion 934, and two opposite ends of the bar-shaped adhesive portion 934 are connected with the ring-shaped adhesive portion 932. The ring-shaped adhesive portion 932 is located in the ring-shaped peripheral region of the silicone base 91, the bar-shaped adhesive portions 934 are located in the central region and demarcates the central region into two non-adhesive sub-regions. The plurality of key-accommodation protrusions 1120 are distributed in the two non-adhesive sub-regions. In addition, different from the illustration of FIG. 1A-1C, the silicone base 91 has an elongated shape, and the two non-adhesive sub-regions have equal numbers of key-accommodation protrusions 1120 distributed therein.

Embodiment 10

Figure 10A:
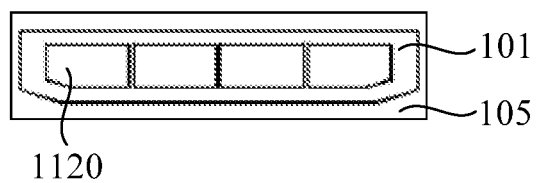
FIG. 10A is a schematic top view of a keypad protective cover assembly according to an embodiment of the invention.
Figure 10B:
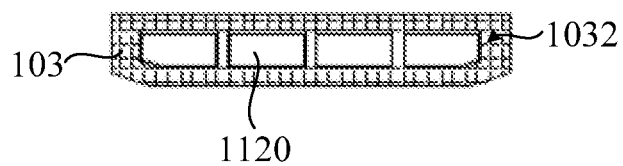
FIG. 10B is a schematic bottom view of the keypad protective cover assembly shown in FIG. 10A without showing the releasable protective paper.

Referring to FIG. 10A and FIG. 10B, a keypad protective cover assembly 100 includes a silicone base 101, a patterned double-sided adhesive layer 103 and a releasable protective paper 105.

The silicone base 101 has an inner surface and an outer surface opposite to the inner surface. The silicone base 101 is exemplarily made of a silicone material and typically is transmissive to visible light.

The patterned double-sided adhesive layer 103 is attached onto the inner surface of the silicone base 101. The patterned double-sided adhesive layer 103 is exemplarily a 3M double-sided adhesive tape.

The releasable protective paper 105 is attached onto a side of the patterned double-sided adhesive layer 103 facing away from the inner surface of the silicone base 101 and thereby the patterned double-sided adhesive layer 103 is sandwiched between the silicone base 101 and the releasable protective paper 105.

As illustrated in FIG. 10A and FIG. 10B, the silicone base 101 includes a central region and a ring-shaped peripheral region surrounding the central region. The ring-shaped peripheral region has the patterned double-sided adhesive layer 103 located therein. The central region is disposed with a plurality of key-accommodation protrusions 1120 protruded from the outer surface and spaced from one another.

Moreover, the patterned double-sided adhesive layer 103 includes a ring-shaped adhesive portion 1032. The ring-shaped adhesive portion 1032 is located in the ring-shaped peripheral region of the silicone base 101. The plurality of key-accommodation protrusions 1120 are distributed in the central region. In addition, different from the illustration of FIG. 1A-1C, the silicone base 101 has an elongated shape, and the patterned double-sided adhesive layer 103 has no bar-shaped adhesive portion and thus is ring-shaped.

Embodiment 11

Figure 11A:
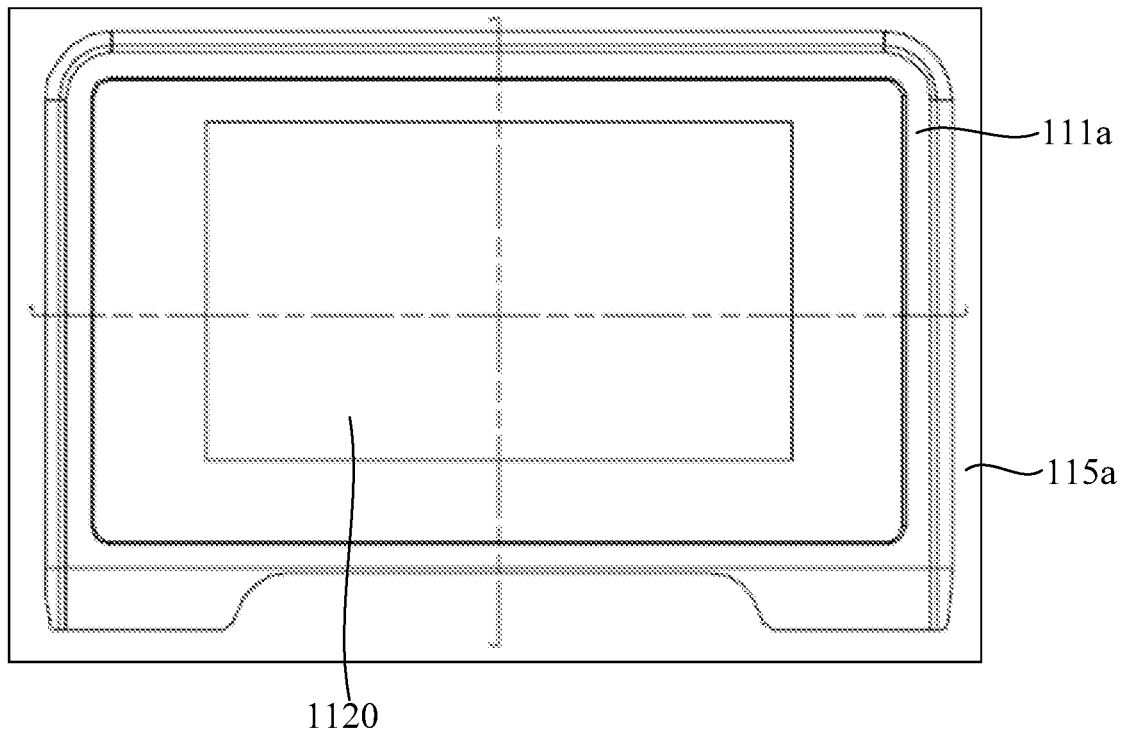
FIG. 11A is a schematic top view of a keypad protective cover assembly according to an embodiment of the invention.
Figure 11B:
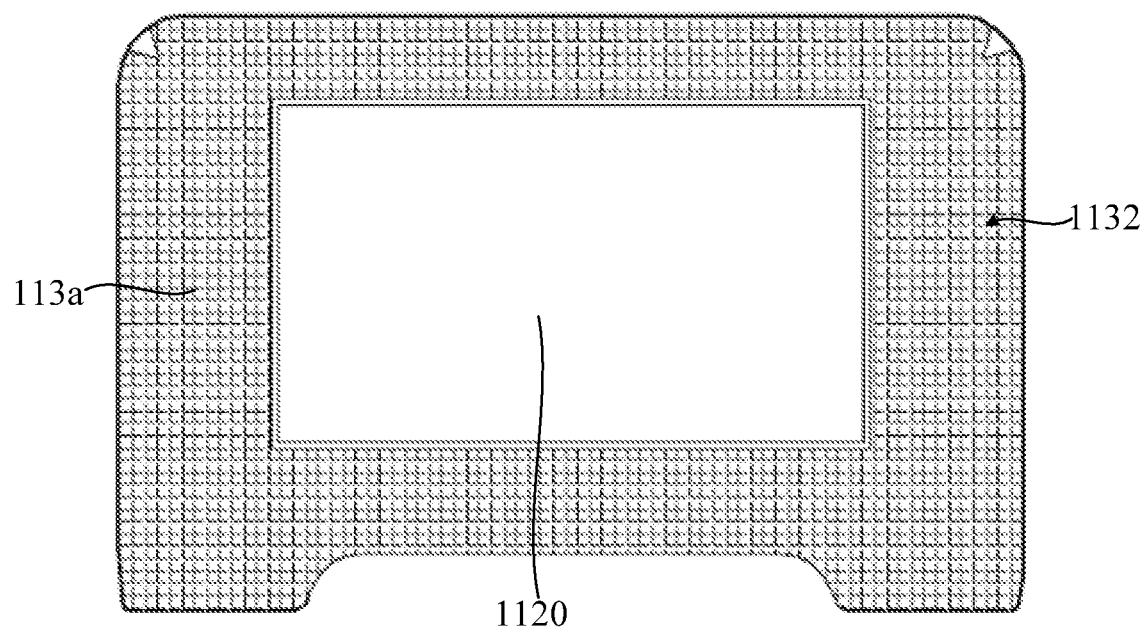
FIG. 11B is a schematic bottom view of the keypad protective cover assembly shown in FIG. 11A without showing the releasable protective paper.

Referring to FIG. 11A and FIG. 11B, a keypad protective cover assembly 110 includes a silicone base 111*a*, a patterned double-sided adhesive layer 113*a* and a releasable protective paper 115*a*.

The silicone base 111*a* has an inner surface and an outer surface opposite to the inner surface. The silicone base 111*a* is exemplarily made of a silicone material and typically is transmissive to visible light.

The patterned double-sided adhesive layer 113*a* is attached onto the inner surface of the silicone base 111*a*. The patterned double-sided adhesive layer 113*a* is exemplarily a 3M double-sided adhesive tape.

The releasable protective paper 115*a* is attached onto a side of the patterned double-sided adhesive layer 113*a* facing away from the inner surface of the silicone base 111*a* and thereby the patterned double-sided adhesive layer 113*a* is sandwiched between the silicone base 111*a* and the releasable protective paper 115*a*.

As illustrated in FIG. 11A and FIG. 11B, the silicone base 111*a* includes a central region and a ring-shaped peripheral region surrounding the central region. The ring-shaped peripheral region has the patterned double-sided adhesive layer 113*a* located therein. The central region is disposed with a key-accommodation protrusion 1120.

Moreover, the patterned double-sided adhesive layer 113*a* includes a ring-shaped adhesive portion 1132. The ring-shaped adhesive portion 1132 is located in the ring-shaped peripheral region of the silicone base 111*a*. The key-accommodation protrusion 1120 is located in the central region. In addition, different from the illustration of FIG. 1A-1C, the silicone base 111*a* has a profile of approximate rectangle with rounded corners, the patterned double-sided adhesive layer 113*a* has no bar-shaped adhesive portion and thus is ring-shaped, and there is one key-accommodation protrusion 1120.

Embodiment 12

Figure 12:
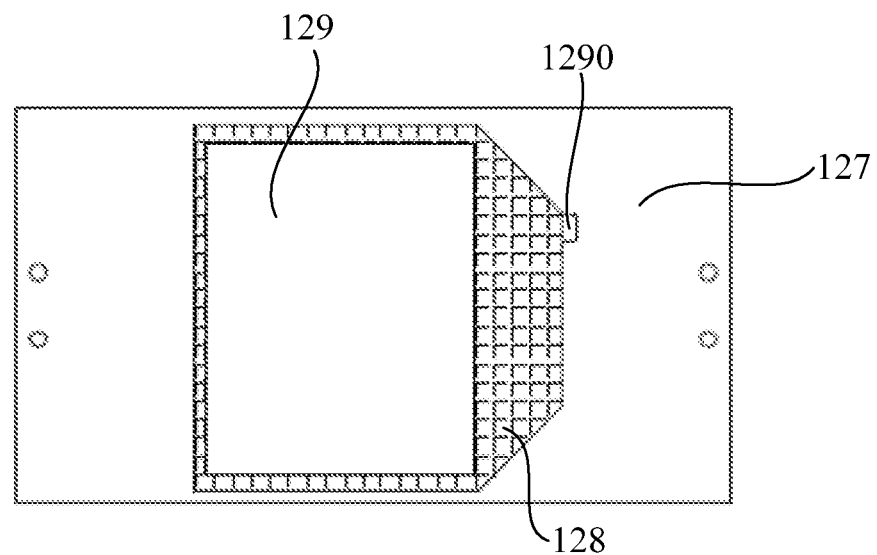
FIG. 12 is a schematic bottom view of a screen protecting member of the display protective cover assembly according to an embodiment of the invention.

Referring to FIG. 12, a screen protecting member of a display protective cover assembly includes: a screen protective film 127, a ring-shaped double-sided adhesive layer 128 and a second releasable protective paper 129.

The ring-shaped double-sided adhesive layer 128 is attached onto the screen protective film 127, the second releasable protective paper 129 is attached onto the ring-shaped double-sided adhesive layer 128 and thereby the ring-shaped double-sided adhesive layer 128 is sandwiched between the screen protective film 127 and the second releasable protective paper 129. The second releasable protective paper 129 completely covers the ring-shaped double-sided adhesive layer 128. Exemplarily, the screen protective film 127 is made of polythylene terephthalate (PET) and has a harness of pencil hardness 4H, the ring-shaped double-sided adhesive layer 128 is a 3M double-sided adhesive tape, the second releasable protective paper 129 is formed with a tab 1290 for facilitating the removing of the second releasable protective paper 129 from the ring-shaped double-sided adhesive layer 128. In addition, different from the illustration of FIG. 3C-3E, the ring-shaped double-sided adhesive layer 128 has one side with larger width than that of the other three sides, and the ring-shaped double-sided adhesive layer 128 is spaced from outer edges of the screen protective film 127.

Embodiment 13

Figure 13:
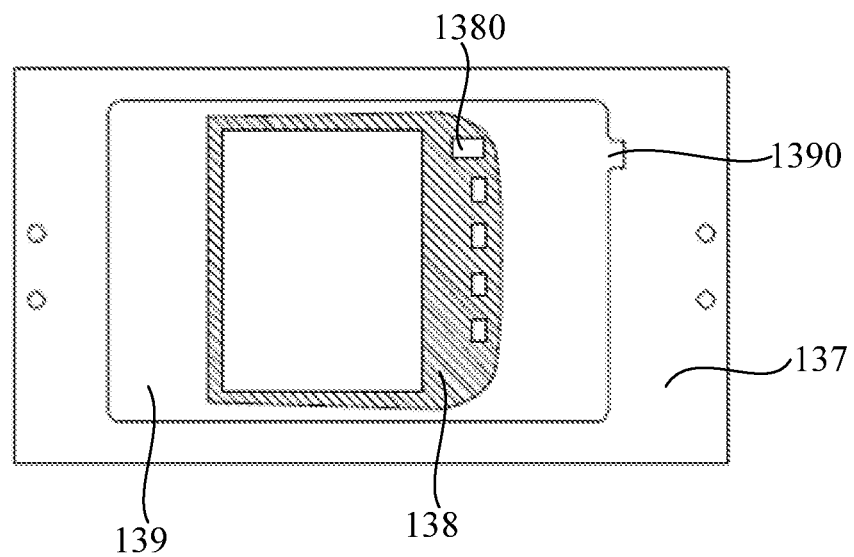
FIG. 13 is a schematic bottom view of a screen protecting member of a display protective cover assembly according to an embodiment of the invention.

Referring to FIG. 13, a screen protecting member of a display protective cover assembly includes: a screen protective film 137, a ring-shaped double-sided adhesive layer 138 and a second releasable protective paper 139.

The ring-shaped double-sided adhesive layer 138 is attached onto the screen protective film 137, the second releasable protective paper 139 is attached onto the ring-shaped double-sided adhesive layer 138 and thereby the ring-shaped double-sided adhesive layer 138 is sandwiched between the screen protective film 137 and the second releasable protective paper 139. Exemplarily, the screen protective film 137 is made of polythylene terephthalate (PET) and has a harness of pencil hardness 4H, the ring-shaped double-sided adhesive layer 138 is a 3M double-sided adhesive tape, the second releasable protective paper 139 is formed with a tab 1390 for facilitating the removing of the second releasable protective paper 139 from the ring-shaped double-sided adhesive layer 138. In addition, different from the illustration of FIG. 3C-3E, the ring-shaped double-sided adhesive layer 138 has one side with larger width than that of the other three sides, the side with larger width is further formed with a plurality of openings 1380, and the ring-shaped double-sided adhesive layer 138 is spaced from outer edges of the screen protective film 137.

Embodiment 14

Figure 14:
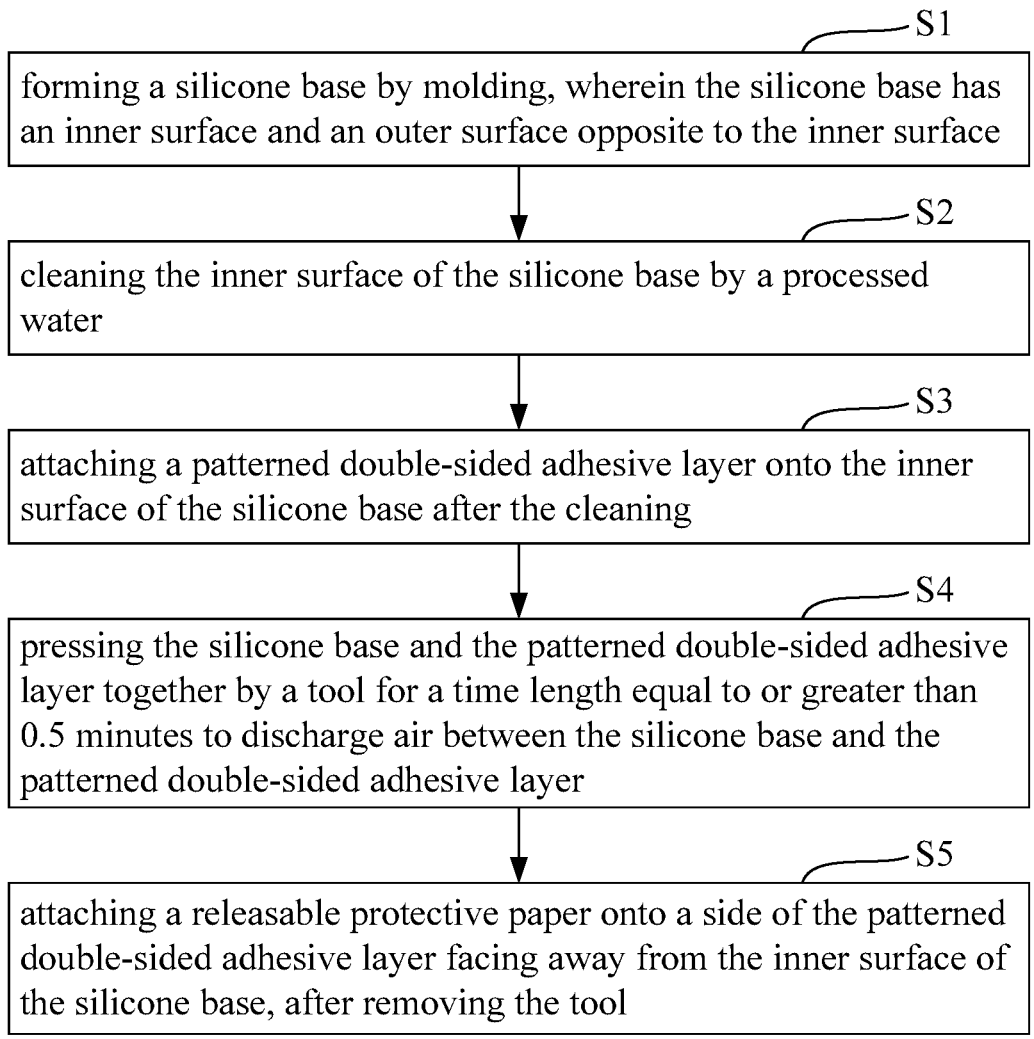
FIG. 14 is a schematic flowchart of a manufacturing method of a protective cover assembly according to an embodiment of the invention.

Referring to FIG. 14, a manufacturing method of a protective cover assembly exemplarily includes following steps:

S1: forming a silicone base by molding, wherein the silicone base has an inner surface and an outer surface opposite to the inner surface;

S2: cleaning the inner surface of the silicone base by a processed water;

S3: attaching a patterned double-sided adhesive layer onto the inner surface of the silicone base after the cleaning;

S4: pressing the silicone base and the patterned double-sided adhesive layer together by a tool for a time length equal to or greater than 0.5 minutes to discharge air between the silicone base and the patterned double-sided adhesive layer;

S5: attaching a releasable protective paper onto a side of the patterned double-sided adhesive layer facing away from the inner surface of the silicone base, after removing the tool.

More specifically, the manufacturing method can be used for manufacturing the keypad protective cover assembly including a silicone base, a patterned double-sided adhesive layer and a releasable protective paper as described in any one of the above embodiments and for manufacturing the sealing member (including a silicone base, a patterned double-sided adhesive layer and a releasable protective paper) of the display protective cover assembly as described in any one of the above embodiments. In addition, in the step S2, the processed water may be a distilled water; and in the step S4, the time length is preferably in a range of 0.5-3 minutes so as to achieve the purpose of discharging/eliminating air bubbles between the silicone base and the patterned double-sided adhesive layer as much as possible, and the tool may be a fixture or clamping apparatus.

In addition, it can be understood that the above-mentioned embodiments are only illustrative descriptions of the invention, on the premise that the technical features are not conflicting, the structures are not contradictory, and the purpose of the invention is not violated, the technical solutions of the various embodiments can be arbitrarily combined and used together.

Finally, it should be noted that the foregoing description merely illustrates some preferable embodiments of the invention, and is not intended to limit the scope of the invention. Any person skilled in the art can make some amendments or modifications as equivalent embodiments according to the above disclosed technical contents without departing from the technical scope of the invention. As long as they are without departing from the technical scope of the invention, any simple amendments, equivalent changes and modifications to the above embodiments according to the technical essence of the invention are still within the technical scope of the invention.

What is claimed is:

1. A protected electronic device, comprising:
    a target electronic device including a main body and a display part having a display screen, wherein a gap exists between the display part and the main body and surrounds the display part; and
    a protective cover assembly including:
        a ring-shaped silicone base with a central opening;
        a first continuous ring-shaped double-sided adhesive layer, attached onto the ring-shaped silicone base;
        a screen protective film; and
        a second continuous ring-shaped double-sided adhesive layer, attached onto the screen protective film;
    wherein the screen protective film is attached onto the display part by the second continuous ring-shaped double-sided adhesive layer to cover the display screen;
    wherein the ring-shaped silicone base is attached onto both the main body and the screen protective film by the first continuous ring-shaped double-sided adhesive layer, and thereby the ring-shaped silicone base, the first continuous ring-shaped double-sided adhesive layer, the screen protective film and the second continuous ring-shaped double-sided adhesive layer are sequentially stacked on the display part in that order;
    wherein outer edges of the screen protective film as well as the gap are covered by the ring-shaped silicone base while the screen protective film is exposed in the central opening, outer edges of the ring-shaped silicone base and the outer edges of the screen protective film are respectively located at two opposite sides of the gap, and inner edges of the ring-shaped silicone base and the outer edges of the ring-shaped silicone base are respectively located at the two opposite sides of the gap;
    wherein air between the ring-shaped silicone base and the first continuous ring-shaped double-sided adhesive layer is discharged by pressing the ring-shaped silicone base and the first continuous ring-shaped double-sided adhesive layer via a tool for a time length equal to or greater than 0.5 minutes.

2. A protected electronic device, comprising:
    a target electronic device including a main body and a display part having a display screen, wherein a gap exists between the display part and the main body and surrounds the display part; and
    a protective cover assembly including:
        a ring-shaped silicone base, having an inner surface and an outer surface opposite to the inner surface;
        a first continuous ring-shaped double-sided adhesive layer, attached onto the inner surface of the ring-shaped silicone base;
        a screen protective film; and
        a second continuous ring-shaped double-sided adhesive layer, attached onto the screen protective film;
    wherein the screen protective film is attached onto the display part by the second continuous ring-shaped double-sided adhesive layer to cover the display screen;
    wherein the ring-shaped silicone base comprises a central opening region and a ring-shaped peripheral region surrounding the central opening region, and the ring-shaped peripheral region has the first continuous ring-shaped double-sided adhesive layer located therein;
    wherein the ring-shaped silicone base is attached onto both the main body and the screen protective film by the first continuous ring-shaped double-sided adhesive layer and thereby the ring-shaped silicone base, the first continuous ring-shaped double-sided adhesive layer, the screen protective film and the second continuous ring-shaped double-sided adhesive layer are sequentially stacked on the display part in that order, outer edges of the screen protective film as well as the gap are covered by the ring-shaped silicone base while the screen protective film is exposed in the central opening region of the ring-shaped silicone base, the outer edges of the screen protective film are spaced from and surrounded by the gap, outer edges of the ring-shaped silicone base and the outer edges of the screen protective film are respectively located at two opposite sides of the gap, and inner edges of the ring-shaped silicone base and the outer edges of the ring-shaped silicone base are respectively located at the two opposite sides of the gap.

3. The protected electronic device as claimed in claim 2, wherein the ring-shaped silicone base has a portion non-overlapped with the screen protective film and located at a side of the outer edges of the screen protective film away from the display screen, and the portion non-overlapped with the screen protective film belongs to the ring-shaped peripheral region.

4. The protected electronic device as claimed in claim 2, wherein the screen protective film has a hardness of pencil hardness 4H, and the screen protective film is made of polyethylene terephthalate (PET).

5. The protected electronic device as claimed in claim 2, wherein the display part further comprises a peripheral portion surrounding the display screen, the gap exists between the main body and the peripheral portion, and the screen protective film fully covers the display screen but partially covers the peripheral portion.

\* \* \* \* \*